Oct. 25, 1966 A. M. LUECK 3,281,606

SMALL LIGHT SENSOR PACKAGE

Filed July 26, 1963

Arthur M. Lueck
INVENTOR
BY John D. Graham
ATTORNEY

United States Patent Office 3,281,606
Patented Oct. 25, 1966

3,281,606

SMALL LIGHT SENSOR PACKAGE

Arthur Mitchell Lueck, Dallas, Tex., assignor to Texas Instruments Incorporated, Dallas, Tex., a corporation of Delaware Filed July 26, 1963, Ser. No. 297,884
8 Claims. (Cl. 250—239)

This invention relates to semiconductor devices, and more particularly to hermetically sealed miniature enclosures therefor.

The increasing demand for miniature electronic components has prompted the development of several types of miniature semiconductor device packages. Among such components is the light sensor or photo-diode device. Application of these devices in the computer field is especially important when used in card readout equipment. For example, a light source is placed on one side of the card and a light sensing device on the other. As the card is moved, the light-sensitive device will be activated each time a hole is encountered in the card that allows light to pass through. To be able to read a row of closely punched holes across the card requires the light sensing devices to be extremely small and capable of being mounted close together as, for example, on a small strip of a printed circuit board.

It is therefore an object of this invention to provide a small hermetically sealed device package.

Another object of the invention is to provide an extremely small semiconductor device package which will allow light to pass through one portion thereof.

Another object of this invention is a semiconductor device of minimal dimensions and of a configuration which allows flexibility in circuit design. Thus, the device may be used in the conventional manner on circuit boards or in a variety of ways that allow for maximum space utilization.

Other objects and features of the invention will be apparent from the following detailed description, taken in conjunction with the appended claims and the attached drawing in which:

In accordance with the invention, an improved miniature device container is fabricated by taking a glass lens mounted on a metallic ring and brazing the ring to another ring which, in turn, has been brazed to a ceramic cylinder. The cylinder is then brazed onto a metallic block, onto which a semiconductor device has been or can be mounted.

Figure 1:
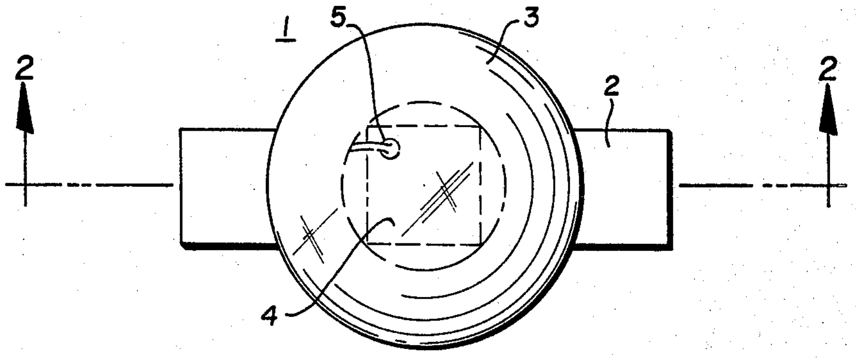
FIGURE 1 is a top view of the semiconductor package of the invention.
Figure 2:
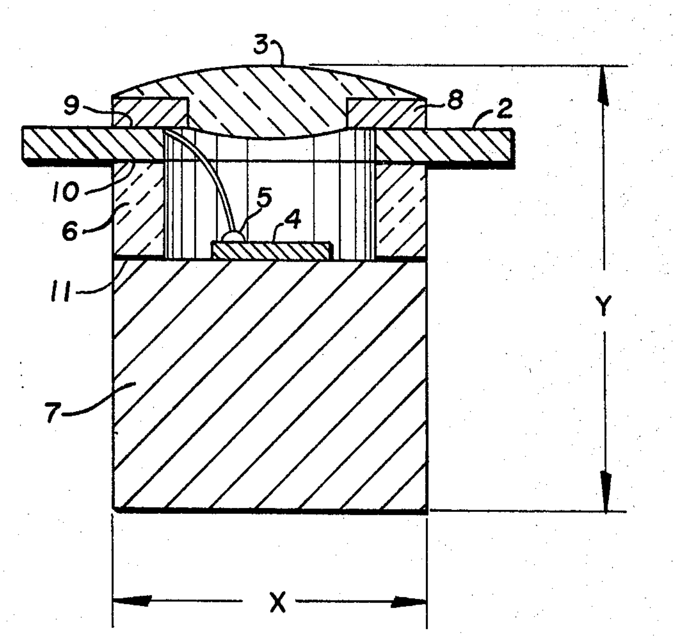
FIGURE 2 is a side view in section taken through line 2—2 of FIGURE 1.

Referring, now, to FIGURES 1 and 2, there is shown a miniature light sensor package 1. A circular metal block 7 has a light-sensitive device 4 mounted thereon. The block 7 may be of any suitable material, such as for example Kovar, a nickel, iron, cobalt alloy. On the periphery of block 7 is mounted a ceramic cylinder 6, joined through common interface 11 by any suitable means such as brazing. Joined to the ceramic cylinder at interface 10 is a metal ring 2 with two oppositely disposed tabs extending out from the outer diameter of the ring. Either tab may be used as a terminal for electrically connecting the device in a circuit. The second terminal is the metallic block 7 on which the light-sensitive element is mounted. Sealing the package is a lens 3 mounted and bonded onto a metallic ring 8. This ring-lens assembly is brazed to ring 2 at interface 9. Prior to sealing, a lead is attached to semiconductor element 4 at point 5 and to ring 2, completing the circuit path between the terminals. The rings 2 and 8 may be of any suitable material, as for example, Kovar. The lens-ring assembly may be similar in construction to the one described in my copending application Serial No. 268,626 filed March 21, 1963, and assigned to the assignee of the present application.

By way of example and to illustrate the degree of miniaturization which is possible with the package of the invention, the dimensions X and Y shown in FIGURE 2 may be approximately $X=0.061$ inch and $Y=0.088$ inch, respectively.

It is to be understood that the form of the invention, herein shown and described, is to be taken as a preferred example of the same and that various changes in the shape, size and arrangement of the parts may be resorted to without departing from the spirit and scope of the invention as defined by the appended claims.

What is claimed is:

1. A semiconductor device container comprising a cylindrical metallic member having a ceramic cylinder hermetically bonded thereto, a metallic ring having two oppositely disposed tabs, said metallic ring being mounted upon and bonded to said ceramic cylinder, and a lens-ring combination counted upon and bonded to said metallic ring.

2. A semiconductor device container comprising a metallic member having a ceramic cylinder brazed thereto, a metallic ring, said metallic ring being mounted upon and brazed to said ceramic cylinder, and a lens-metallic ring combination mounted upon and brazed to said metallice ring, whereby light is transmitted through said lens into the interior of said container.

3. A light-sensitive device comprising a light-sensitive element mounted upon a metallic member, said member having a ceramic cylinder secured thereto, a metallic ring, having two oppositely disposed tabs, said ring being mounted upon and brazed to said ceramic cylinder, a connecting wire, one end of said wire being attached to a point on the surface of said light-sensitive element and the other end of said wire being attached to said metallic ring, and a lens means combination bonded to said metallic ring.

4. The device according to claim 3, wherein the light-sensitive element and lens are so mounted as to permit light to pass through said lens and impinge upon the surface of said light-sensitive element.

5. A light-sensitive device comprising; a light-sensitive means mounted on and in an electrically conductive relation with a first metallic member, an insulating member mounted on and secured at one portion thereof to said first metallic member and at least partially enclosing said light-sensitive means, a second metallic member mounted on and secured to a portion of said insulating member spaced from said one portion and electrically isolated from said first metallic member, lens means secured to said second metallic member enclosing said light-sensitive means within the area defined by said first and second metallic members and said insulating member, said lens means admitting light therethrough to said light-sensitive means, and means electrically connecting said light-sensitive means with said second metallic member.

6. A hermetically sealed light-sensitive device comprising; a metallic member having a mounting surface thereon, a ceramic cylindrical member mounted on and secured to said metallic member surrounding said mounting surface, a first metallic ring mounted on and secured to said ceramic cylinder, a portion of said ring extending beyond the periphery of said cylinder, lens means having a metallic ring-part, said ring-part mounted on and secured to said first metallic ring, a light-sensitive element secured to said mounting surface, and means electrically connecting a part of said light-sensitive element to said first metallic ring.

7. A hermetically sealed light-sensitive device comprising; a cylindrical ceramic member, a metallic member secured to and sealing one end of said cylindrical member, a lens means secured to and enclosing the other end of said cylindrical member, a metallic ring sealed between said lens member and said cylindrical member, and a light-sensitive device electrically connected between said metallic member and said metallic ring.

8. A light-sensitive device comprising, a cylindrical first metal member having a mounting surface thereon, a silicon light-sensitive means mounted on said metallic member and being in electrically conductive relation with said mounting surface, a hollow cylindrical ceramic member mounted on and hermetically sealed to the mounting surface of said cylindrical metallic member surrounding said light-sensitive means, said cylindrical metallic member enclosing the end of said ceramic member to which it is secured, a second metallic member mounted on and secured to said ceramic member on the end opposite said first metallic member, said second metallic member having a central opening corresponding to the hollow portion of said hollow ceramic cylinder and having a portion thereof projecting beyond the periphery of said ceramic cylinder, lens means secured to said second metallic member, said lens means including a glass portion and a metallic member having a central opening therein, said glass portion bonded to said metallic member and extending through said central opening forming a lens to pass light through to said light-sensitive member, said lens means enclosing the end of said hollow cylinder to hermetically seal said light-sensitive means within said hollow ceramic cylinder, and a conductive wire connected between said light-sensitive means and said second metallic member.

References Cited by the Examiner

UNITED STATES PATENTS

| | | | |
|---|---|---|---|
| 2,640,901 | 6/1953 | Kinman | 317—234 |
| 2,644,852 | 7/1953 | Dunlap | 317—234 |
| 2,796,563 | 6/1957 | Ebers et al. | 317—234 |
| 3,004,168 | 10/1961 | Emeis | 250—239 X |

FOREIGN PATENTS

| | | |
|---|---|---|
| 1,352,431 | 4/1963 | France. |

RALPH G. NILSON, *Primary Examiner*.

J. D. WALL, *Assistant Examiner*.